United States Patent
Kuznetsov et al.

(10) Patent No.: US 6,329,304 B1
(45) Date of Patent: Dec. 11, 2001

(54) FLOATING WAFER REACTOR AND METHOD FOR THE REGULATION OF THE TEMPERATURE THEREOF

(75) Inventors: Vladimir Ivanovich Kuznetsov, Delft; Ernst Hendrik August Granneman, Hilversum, both of (NL)

(73) Assignee: A.S.M. International N.V., Bilthoven (NL)

( * ) Notice: Subject to any disclaimer, the term of this patent is extended or adjusted under 35 U.S.C. 154(b) by 0 days.

(21) Appl. No.: 09/552,987

(22) Filed: Apr. 21, 2000

(30) Foreign Application Priority Data

Apr. 21, 1999 (NL) .................................................. 1011856

(51) Int. Cl.$^7$ ........................ H01L 21/00; C23C 16/00
(52) U.S. Cl. .................. 438/799; 438/795; 427/482; 118/724; 118/718; 219/411
(58) Field of Search .................. 427/482, 457, 427/532, 545, 549, 592; 438/795, 799, 800; 118/724, 50, 50.1, 718, 719, 723 R, 620, 722; 156/345; 219/411, 390, 391, 496; 392/416, 418

(56) References Cited

U.S. PATENT DOCUMENTS

| 4,495,024 | * | 1/1985 | Bok | 216/57 |
|---|---|---|---|---|
| 4,560,590 | * | 12/1985 | Bok | 427/294 |
| 4,575,408 | * | 3/1986 | Bok | 250/492.3 |
| 5,314,848 | * | 5/1994 | Yasui et al. | 438/248 |
| 6,018,616 | * | 1/2000 | Schaper | 392/418 |
| 6,097,005 | * | 8/2000 | Akimoto | 219/444.1 |

FOREIGN PATENT DOCUMENTS

| 0 537 364 A1 | 4/1993 | (EP) . |
|---|---|---|
| WO 87/04853 | 8/1997 | (WO) . |

* cited by examiner

Primary Examiner—Gregory Mills
Assistant Examiner—P. Hassanzedeh
(74) Attorney, Agent, or Firm—Knobbe, Martens, Olson & Bear, LLP

(57) ABSTRACT

Floating wafer provided with heating elements which, by means of a controller, keep the walls of the floating wafer reactor at the desired temperature. By means of the sensors arranged in the walls, this temperate is kept substantially constant. To compensate for the temperature drop occurring during the entering of a wafer, which is caused by the absorption of warmth by the comparatively cold wafer, and to limit temperature variation in the processing area as much as possible, it is proposed to immediately supply an amount of energy to the heating elements, independently of the reaction of the sensors, during entering of the wafer.

6 Claims, 2 Drawing Sheets

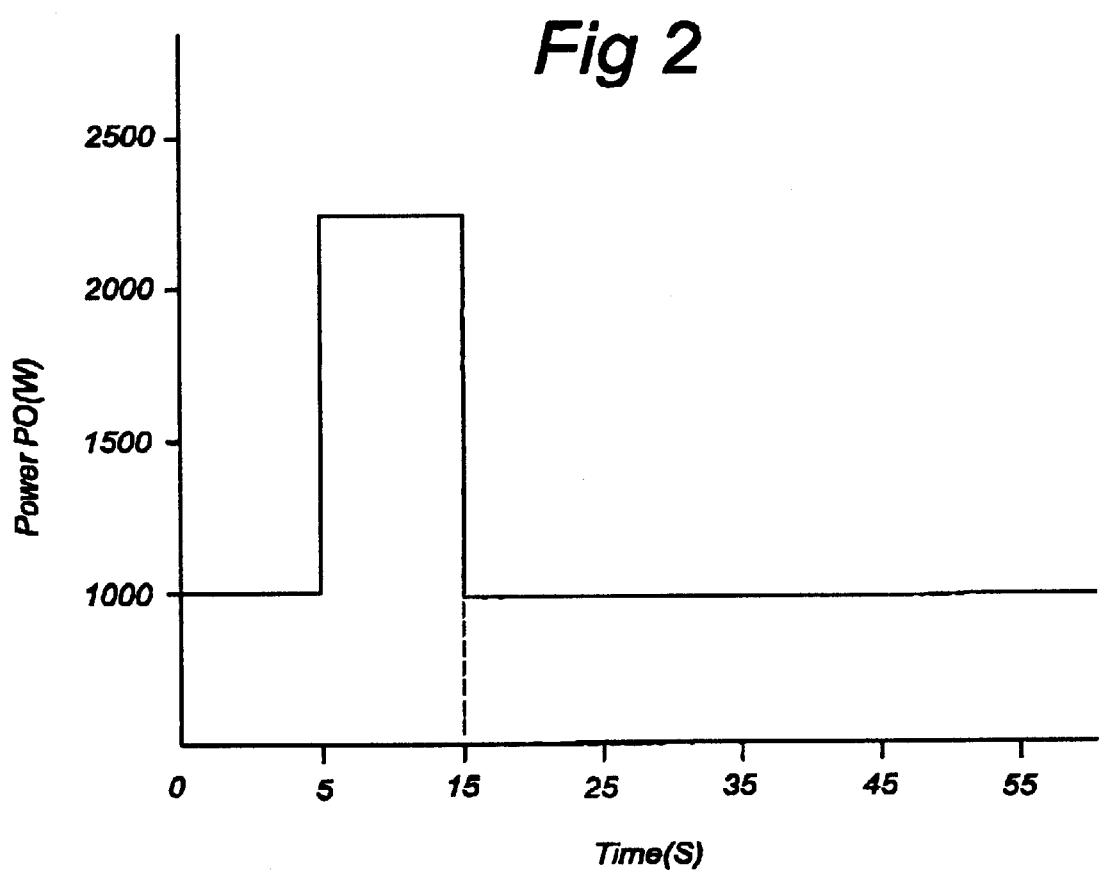

FLOATING WAFER REACTOR AND METHOD FOR THE REGULATION OF THE TEMPERATURE THEREOF

FIELD OF THE INVENTION

The present invention relates to a floating wafer reactor, comprising a processing area at least bounded by walls, wherein heating means are arranged, wherein temperature sensors are arranged which are connected to a controller for the regulation of those heating means.

BACKGROUND OF THE INVENTION

Such a reactor is generally known in the state of the arts There, a wafer is held at a very small distance from facing walls of the reactor by gas flowing from both sides of the wafer. This gas comprises the required reactants. Such a reaction can take place at a comparatively high temperature such as approximately 1000° C. To that end, the walls or plates of the floating wafer reactor are heated, which takes place with the help of heating elements. The energy supply to these electrical heating elements takes place by means of a controller which is regulated by sensors which are either close to the processing area or somewhat deeper in the walls of the floating wafer reactor. The gas supplied to the processing area is heated to the desired temperature beforehand. Apart from the entering and leaving of wafers, the temperature control is comparatively easy and, temperature-wise, a very stable system arises, as the furnace should preferably be continually at the same temperature.

Problems occur during the entering of the wafers in the processing area, however. These will generally be at a comparatively low temperature, for example, at room temperature. Due to the small distance between the walls of the reactor and the wafer, a very rapid heating of the wafer takes place, typically from some seconds to some minutes. The heat capacity of the wafer is much smaller than the heat capacity of the walls. In a typical case, when the temperature of the wafer is elevated from room temperature to 1000° C., a lowering of the temperature by approximately 10° C. occurs immediately on the border between the walls and the processing area of the reactor. Internally of the walls, that is, further away from the border with the processing area, this temperature decrease will be smaller and, if no fiber measures are taken, a temperature drop of the walls of approximately 3° C. can be caused in the long term. This is obviously compensated for by the detection of the sensors present in the walls which will supply extra energy via the controller to the heating elements.

As the heating elements are some distance from the processing area, and the area in between will generally be filled with a ceramic material with a certain heat capacity where the heat is not optimally conducted, there will be some time lag.

For a number of processes, this is particularly undesirable. There, it is important that the temperature in the processing chamber is kept within a narrow range and may not be too high or too low, to be able to correctly control the reaction which takes place in the processing chamber.

SUMMARY OF THE INVENTION

The present invention aims to provide a floating wafer reactor wherein the temperature is controlled such that the entering of a wafer at a comparatively low temperature does not have the negative effects discussed here, that is, that an immediate, adequate reaction occurs to the instantly occurring temperature drop on the boundary surface between the walls of the reactor and the processing area.

This aim is achieved in a floating wafer reactor described above in that means are arranged which, during the entering of the wafer into the processing area, influence the controller such that an amount of energy is supplied to the heating means for a certain time independently of the sensors.

By immediately supplying the heating elements with a pulse of energy during the entering of the wafer, the slowness of the measuring of the temperature drop by the sensors, on the one hand, and the transfer of heat from the heating elements to the processing chamber, on the other hand, is largely or completely removed. "During the entering" has to be understood as both some time before the entry of the wafer, the moment of entering of the wafer and some time thereafter. All of those clearly expressed in seconds or a shorter time, such that this time is substantially shorter than the reaction time of the sensors and the heat exchange between the heating elements and the boundary between the processing area and the walls of the reactor, respectively.

The control of the heating elements can comprise any construction known in the state of the art, but is preferably realized as a cascade control system. Such a cascade control system can be realized with the help of two thermocouples or sensors, wherein one thermocouple is arranged close to a wafer and another thermocouple is arranged closer to the heating element.

According to the invention, a temperature control system consists of two parts. A first part that works with the help of sensors and keeps the temperature of the sensors in the processing area constant in the long term, and a second part that reacts to the introduction of a wafer in the processing area and gives an adequate energy pulse to entirely or largely compensate for the energy absorbed by the wafer.

Due to the presence of the second control part, it is advantageous that the sensor of the first control part which is close to the wafer is not arranged as close as possible to the wafer but at some distance from the boundary between the processing area. A value of 20 mm is given as an example. In this way, the short, sharp temperature fluctuations caused by the introduction of the wafers is only detected by this sensor in a very damped manner.

The invention also relates to a method for the controlling of the temperature in a floating wafer reactor comprising the supply of energy to the heating elements by a controller, which controller is influenced by sensors arranged in the walls of the floating wafer reactor. According to the invention, the controller is influenced during the entry of a wafer in the processing area of a floating wafer reactor such that an amount of energy is added to the electrical heating elements, independently of the sensors. The heating elements can be arranged in the walls but can also comprise lamps and the like.

According to an advantageous embodiment of the invention, the amount of energy supplied to the heating elements is such that this compensates exactly for the amount of energy which is required to heat the said wafer.

It is possible to supply the extra energy pulse, caused by the entering of the wafer, to the heating elements according to some shape known in the state of the art. According to an advantageous embodiment of the invention, the extra pulse is a block pulse, that is, the same amount of energy is supplied constantly during a comparatively short time such as 3–15 seconds.

BRIEF DESCRIPTION OF THE DRAWINGS

The invention will be elucidated further below with reference to an example embodiment, wherein:

FIG. 2 shows a graphical view of the shape of the energy supply over time during the introduction of a wafer.

DETAILED DESCRIPTION OF THE INVENTION

Figure 1:
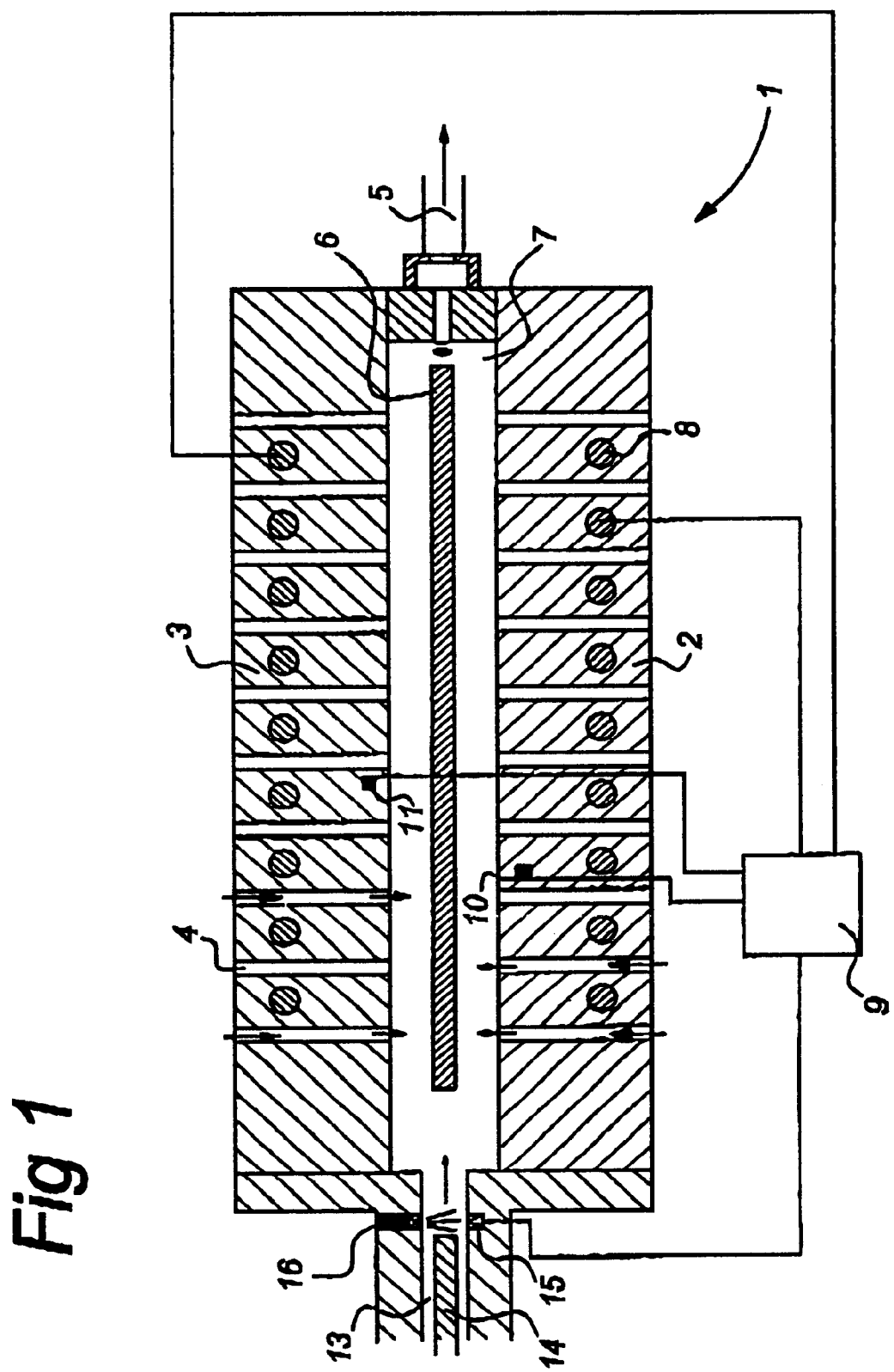
FIG. 1 shows a schematic view of a floating wafer reactor provided with the controller according to the invention.

A very schematic representation of a floating wafer reactor is shown in FIG. 1. This is indicated as a whole by 1 and consists of two facing walls or plates 2,3 which are each provided with a gas inlet channel 4 and wherein a common gas outlet channel 5 is present Details of the gas inlet and outlet are not shown further. In the processing area 7 bounded between the walls, a wafer 6 is taken in. Due to the supplied amount of gas, this is kept stable in the middle between the walls and, as the gas comprises a processing product, the wafer undergoes a reaction. This reaction can take place at 1000° C., for example. To bring the wafer to that temperature, the heating elements are present in the walls 2,3. The supplied gas is already heated to that temperature. The energy that is generated by the heating elements a is controlled by controller 9. Sensors 10 and 11 are connected to the controller and the heating elements 8 are controlled depending on the temperature detected by these sensors.

Wafers are entered through a very schematically shown delivery opening 13. An arriving wafer is indicated by 14. A light sensor 15 is present which reacts to the bred of a light signal coming from the light source 16 by wafer 14.

The walls 2,3 can be moved away from each other in any manner to make room for the introduction of a new wafer 14 and the removal of wafer 6. Such constructions are generally known in the state of the art.

In the construction shown in FIG. 1, the temperature of wafer 14 is substantially room temperature, while this must be heated to a temperature of approximately 1000° C., the temperature at which wafer 6 is treated. The mass of a 200 mm wafer is approximately 60g, while the mass of a floating wafer reactor, and more particularly the part that is brought to an elevated temperature, is some tens of kilos. This means that the heat capacity of the wafer is much smaller than the heat capacity of the reactor. Despite this, a noticeable temperature drop occurs at the boundary between walls 2,3 and the processing area 7 during the introduction of a wafer. If no further measures are taken, this temperature drop will be momentarily 10° C., for example, and the final total temperature drop of the reactor without reaction of the sensors 10, 11 will be approximately 3° C. This temperature drop will obviously be detected by the sensors 10, 11 and compensated for by the heating elements 8. Considering the slowness of these sensors, some time is also necessary during which heat from the elements 8 is transported to the processing area. In the shape of time, the temperature will become excessive, meaning that the reactor will be too warm. For this reason, high demands are placed on the controller 9, but it is absolutely not possible to avoid the temperature drop that occurs during the entry of wafer 6 and 14 respectively.

According to the invention, such an anticipating control of heating elements 8 can be realized by giving a signal to controller 9 if wafer 14 cuts the path of the light coming from source 16 to sensor 15, that is, sensor 15 no longer detects light. According to the data stored in the controller 9, an energy pulse is then supplied to heating element 8. This energy pulse can have any duration and any shape. An example of such a pulse is shown in FIG. 2. Without the entering of a wafer, an energy supply of 1000 watt is sufficient to keep the temperature of the reactor at the desired value. After 5 seconds, a wafer 14 will be brought into the reactor and, at the interrupting of the light beam to sensor 15, a signal will be given to controller 9 after 5 seconds which immediately gives a pulse to heating element 8. An extra amount of energy of approximately 1250 watt is supplied to the heating elements for 10 seconds. This amount of energy is independent of that which is detected by the sensors and is preferably approximately equal to the amount of energy which is absorbed by the wafers 6 and 14, respectively, during heating from room temperature to the desired temperature in the processing area 7. Controller 9 will then once again only react to pulses from sensors 10 and 11.

Due to the extra supply of energy, not only the temperature in the walls 2,3 of the reactor will remain substantially constant and more particularly the drop of the temperature close to the boundary between the walls of the processing area will be substantially compensated for, but a somewhat quicker heating of the wafer will occur. For a 200 mm wafer, the energy use for heating to approximately 1000° C. from room temperature is typically 50 kilojoules. If the pulse is 10 seconds long, 5 kilowatt extra should be supplied. If the pulse is 20 seconds long, this power can clearly be halved. In place of a block pulse, it is possible to initially supply the energy with a higher value and then to decrease it.

It is clear that the invention above is described with reference to a preferred embodiment It is possible to detect the entry of the wafer in smother manner. It is also possible to start the supply of extra energy before the actual entry of the wafer in the processing area and to let the total supplied extra energy be higher to compensate for the opening of the processing area It is also possible to assume a fixed rhythm of the supply of wafers and, based on this, to supply extra amounts of energy independently of the wafers. This and further changes are clear to those skilled in the state of the art and lie within the scope of the attached claims.

What is claimed is:

1. A method of regulating a temperature in a floating wafer reactor, comprising supplying energy to electrical heating elements arranged in walls of the floating wafer reactor, maintaining the temperature of the floating wafer reactor at a predetermined value by influencing a controller through sensors arranged in the walls of the floating wafer reactor, and, upon entry of a wafer in a processing area of the wafer reactor, influencing the controller such that in addition to supplying energy to the electrical heating elements to maintain the temperature of the reactor at the predetermined value, an energy pulse is supplied to the electrical heating elements to compensate for the energy absorbed by the wafer.

2. The method according to claim 1, wherein the energy pulse provides energy that corresponds substantially with energy required to heat an introduced wafer to a predetermined temperature.

3. The method according to claim 1, wherein the energy pulse has a duration of between 3–15 seconds.

4. The method according to claim 1, wherein the energy pulse supplies energy that is substantially constant per time unit.

5. The method according to claim 1, wherein a start of the energy pulse coincides with the entry of the wafer in the processing area.

6. A method of regulating a temperature in a floating wafer reactor, comprising:

operating a controller to supply energy to electrical heating elements coupled to a processing area of the floating wafer reactor to heat the processing area;

influencing the controller as a function of a temperature sensed by temperature sensors coupled to the processing area to maintain the temperature of the floating wafer reactor at a predetermined value; and influencing the controller to supply an energy pulse to the electrical heating elements upon entering of a wafer into the processing area of the floating wafer reactor to compensate for the energy absorbed by the wafer.

* * * * *